(12) United States Patent
Kent

(10) Patent No.: US 8,561,497 B2
(45) Date of Patent: Oct. 22, 2013

(54) WRIST ASSEMBLY FOR ROBOTIC ARM

(75) Inventor: Richard J. Kent, Newbury, NH (US)

(73) Assignee: Fabworx Solutions, Inc., Austin, TX (US)

( * ) Notice: Subject to any disclaimer, the term of this patent is extended or adjusted under 35 U.S.C. 154(b) by 0 days.

(21) Appl. No.: 13/336,848

(22) Filed: Dec. 23, 2011

(65) Prior Publication Data
US 2012/0102717 A1 May 3, 2012

Related U.S. Application Data

(62) Division of application No. 10/919,070, filed on Aug. 16, 2004, now Pat. No. 8,109,172.

(60) Provisional application No. 60/500,524, filed on Sep. 5, 2003, provisional application No. 60/507,438, filed on Sep. 30, 2003, provisional application No. 60/511,158, filed on Oct. 14, 2003, provisional application No. 60/560,406, filed on Apr. 8, 2004, provisional application No. 60/560,798, filed on Apr. 8, 2004.

(51) Int. Cl.
*B25J 17/00* (2006.01)
*B25J 17/02* (2006.01)
*B25J 18/00* (2006.01)

(52) U.S. Cl.
USPC .............................. 74/490.06; 901/21; 901/29

(58) Field of Classification Search
USPC ............... 74/490.01, 490.03, 490.04, 490.05, 74/490.06; 901/21, 28, 29
See application file for complete search history.

(56) References Cited

U.S. PATENT DOCUMENTS

| 5,333,986 | A | 8/1994 | Mizukami et al. |
| 5,682,795 | A | 11/1997 | Solomon et al. |
| 6,077,027 | A | 6/2000 | Kawamura et al. |
| 6,155,131 | A | 12/2000 | Suwa et al. |
| 6,222,337 | B1 | 4/2001 | Kroeker et al. |
| 6,634,851 | B1 | 10/2003 | Bonora et al. |
| 2008/0063504 | A1 | 3/2008 | Kroetz et al. |

OTHER PUBLICATIONS

Asyst's New AXYS Fastswap Advanced Wafer Transport Robot Reduces Wafer-Swap Times by 50-100 Percent; Asyst Technologies, Inc.; press release Jul. 12, 2002; 2 pages.
"Water Transport Robot replaces processed wafer in 4 seconds"; Industrial News Room; Asyst Technologies, Inc.; www.industrialnewsroom.com/fullstory12450; May 13, 2004.

*Primary Examiner* — Justin Krause
(74) *Attorney, Agent, or Firm* — John A. Fortkort; Fortkort & Houston P.C.

(57) ABSTRACT

A wrist assembly (311) for a robotic arm or other mechanical device is provided. The wrist assembly comprises a first arm (313) which terminates in a first radius (317), a second arm (315) which terminates in a second radius (319), and a first band (331) that is devoid of weld joints and the extends around a portion of each of said first and second radii.

19 Claims, 17 Drawing Sheets

WRIST ASSEMBLY FOR ROBOTIC ARM

CROSS-REFERENCE TO RELATED APPLICATIONS

This application is a divisional application claiming priority to U.S. Ser. No. 10/919,070, now allowed, having the same title and the same inventor, and incorporated herein in its entirety, which claims the benefit of U.S. Provisional Application No. 60/500,524, filed on Sep. 9, 2003, entitled "END EFFECTOR FOR ROBOTIC ARM", and incorporated by reference herein in its entirety; U.S. Provisional Application No. 60/507,438, filed on Sep. 30, 2003, entitled "WRIST ASSEMBLY FOR ROBOTIC ARM", and incorporated by reference herein in its entirety; U.S. Provisional Application No. 60/511,158, filed on Oct. 14, 2003, entitled "EDGE GRIP END EFFECTOR", and incorporated by reference herein in its entirety; U.S. Provisional Application No. 60/560,406, filed on Apr. 8, 2004, entitled "ROBOTIC ARM HAVING SPLIT ASSEMBLY", and incorporated by reference herein in its entirety; and U.S. Provisional Application No. 60/560,798, filed on Apr. 8, 2004, entitled "HUB ASSEMBLY FOR ROBOTIC ARM HAVING PIN SPACERS", and incorporated by reference herein in its entirety.

TECHNICAL FIELD OF THE INVENTION

The present invention pertains generally to robotic arms, and more particularly, to wrist assemblies for robotic arms of the type useful in wafer processing equipment.

BACKGROUND OF THE INVENTION

The processing of semiconductor substrates is integral to the manufacture of integrated circuits. Most commonly, these substrates are in the form of silicon wafers that are five to eight inches in diameter, although a variety of other substrates of various sizes are also known. A single wafer can be exposed to a number of sequential processing steps including, but not limited to, chemical vapor deposition (CVD), physical vapor deposition (PVD), etching, planarization, and ion implantation.

The use of robots has become standard in semiconductor processing. Robots can process a large number of substrates through many different processing technologies, and can perform repetitive tasks quickly and accurately. The use of robots thus eliminates human fatigue and minimizes operator errors as factors in the fabrication process.

Most modern semiconductor processing systems include robotic cluster tools that integrate a number of process chambers together in order to perform several sequential processing steps without removing the substrate from the highly controlled processing environment. These chambers may include, for example, degas chambers, substrate pre-conditioning chambers, cooldown chambers, transfer chambers, chemical vapor deposition chambers, physical vapor deposition chambers, and etch chambers. The combination of chambers in a cluster tool, as well as the operating conditions and parameters under which those chambers are run, are selected to fabricate specific structures using a specific process recipe and process flow.

Once the cluster tool has been set up with a desired set of chambers and auxiliary equipment for performing certain process steps, the cluster tool will typically process a large number of substrates by continuously passing them, one by one, through the chambers or process steps. The process recipes and sequences will typically be programmed into a microprocessor controller that will direct, control and monitor the processing of each substrate through the cluster tool. Once an entire cassette of wafers has been successfully processed through the cluster tool, the cassette may be passed to yet another cluster tool or stand alone tool, such as a chemical mechanical polisher, for further processing.

One example of a fabrication system of the type described above is the cluster tool disclosed in U.S. Pat. No. 6,222,337 (Kroeker et al.), and reproduced in FIGS. 1-4 herein. The magnetically coupled robot disclosed therein is equipped with robotic arms having a frog-leg construction that are adapted to provide both radial and rotational movement of the robot blade within a fixed plane. The radial and rotational movements can be coordinated or combined to allow for pickup, transfer and deliver of substrates from one location within the cluster tool to another location. For example, the robotic arm may be used to move substrates from one processing chamber to an adjacent processing chamber.

With reference to FIG. 1, which is a schematic diagram of the integrated cluster tool 10 of Kroeker et al., substrates are introduced into, and withdrawn from, the cluster tool 10 through a cassette loadlock 12. A robot 14 having a blade 17 is located within the cluster tool 10 to transfer the substrates from one process chamber to another. These process chambers include the aforementioned cassette loadlock 12, a degas wafer orientation chamber 20, a preclean chamber 24, a PVD TiN chamber 22 and a cooldown chamber 26. The robot blade 17 is illustrated in the retracted position in which it can rotate freely within the chamber 18.

A second robot 28 is located in transfer chamber 30 and is adapted to transfer substrates between various chambers, including a cooldown chamber 26, a preclean chamber 24, a CVD Al chamber (not shown) and a PVD AlCu processing chamber (not shown). The specific configuration of chambers illustrated in FIG. 1 is designed to provide an integrated processing system capable of both CVD and PVD processes in a single cluster tool. A microprocessor controller 29 is provided to control the fabricating process sequence, conditions within the cluster tool, and the operation of the robots 14, 28.

FIG. 2 is a schematic view of the magnetically coupled robot of FIG. 1 shown in both the refracted and extended positions. The robot 14 (see FIG. 1) includes a first strut 81 rigidly attached to a first magnet clamp 80 and a second strut 82 rigidly attached to a second magnet clamp 80'. A third strut 83 is attached by a pivot 84 to strut 81 and by a pivot 85 to a wafer blade 86. A fourth strut 87 is attached by a pivot 88 to strut 82 and by a pivot 89 to wafer blade 86. The structure of struts 81-83, 87 and pivots 84, 85, 88, and 89 form a "frog leg" type connection of wafer blade 86 to magnet clamps 80,80'.

When magnet clamps 80,80' rotate in the same direction with the same angular velocity, then the robot also rotates about axis x in this same direction with the same velocity. When magnet clamps 80, 80' rotate in opposite directions with the same absolute angular velocity, then there is no rotation of assembly 14, but instead there is linear radial movement of wafer blade 86 to a position illustrated by dashed elements 81'-89'.

With reference to FIGS. 3 and 4, a wafer 35 is shown being loaded on wafer blade 86 to illustrate that the wafer blade can be extended through a wafer transfer slot 810 in a wall 811 of a chamber 32 to transfer such a wafer into or out of the chamber 32. The mode in which both magnet clamps 80, 80' rotate in the same direction at the same speed can be used to rotate the robot from a position suitable for wafer exchange with one of the adjacent chambers 12, 20, 22, 24, 26 (see FIG. 1) to a position suitable for wafer exchange with another of these chambers. The mode in which both magnet clamps 80, 80' rotate with the same speed in opposite directions is then used to extend the wafer blade into one of these chambers and then extract it from that chamber. Some other combination of clamp rotation can be used to extend or retract the wafer blade as the robot is being rotated about axis x.

To keep wafer blade 86 directed radially away from the rotation axes x, an interlocking mechanism is used between the pivots or cams 85, 89 to assure an equal and opposite angular rotation of each pivot. The interlocking mechanism may take on many designs. One possible interlocking mechanism is a pair of intermeshed gears 92 and 93 formed on the pivots 85 and 89. These gears are loosely meshed. To eliminate play between these two gears because of this loose mesh, a weak spring 94 (see FIG. 4) may be extended between a point 95 on one gear to a point 96 on the other gear such that the spring tension lightly rotates these two gears in opposite directions until light contact between these gears is produced.

The use in semiconductor processing of robots of the type depicted in U.S. Pat. No. 6,222,337 (Kroeker et al.) has several advantages, some of which have already been noted. In particular, such robots can improve the speed and accuracy of the manufacturing process. Moreover, the use of robots offers the potential for reducing or eliminating contamination of semiconductor substrates, which is a well known problem attendant to the human handling of such substrates. This consideration is becoming increasingly important as the trend to further reduce the dimensions of integrated circuits continues, since the presence of impurities becomes more damaging and these dimensions are reduced.

Unfortunately, while the use of robots in semiconductor fabrication processes offers many advantages, it also posses some challenges of its own. For example, many robots used in semiconductor processing, including those of the type depicted in U.S. Pat. No. 6,222,337 (Kroeker et al), have wrist assemblies that have been found to exhibit excessive yaw during use. This can result in a number of complications, such as undesirable contact between the robot and the cassette loadlock, which in turn can result in maintenance issues and product contamination. This problem is exacerbated at higher assembly speeds, due to the increased momenta involved. Unfortunately, fabrication plants are being required to operate at ever increasing speeds, due to the need for greater product throughput and efficiency. Hence, excessive yaw is a problem that must be reckoned with. Excessive yaw also causes inaccuracies in the positioning of the wafer. These inaccuracies can result in process failures that may culminate in loss of the wafer. Excessive yaw also accelerates wear in processing equipment due to tooth-to-tooth collisions between gear elements.

Some wrist assemblies have been developed with the goal of addressing the aforementioned problems. One such assembly is shown in FIG. 5. The wrist assembly 201 shown therein comprises first 213 and second 215 arms. The first and second arms terminate, respectively, in first 217 and second 219 radii which rotatingly engage first 221 and second 223 pivots attached to a blade mount 225 by a series of fasteners 227. A blade (not shown) can be secured to the blade mount via machine screws 229.

FIGS. 6 and 7 illustrate the means by which the first 217 and second 219 radii rotatingly engage the first 221 and second 223 pivots. First 231 and second 233 steel bands are provided that wrap around a portion of the radius of each of the first 217 and second 219 radii. The first band 231 is secured to the first radius 217 by means of a first tension plate 241, and is secured to the second radius 219 by means of a first terminus 253. Similarly, the second band 233 is secured to the second radius 219 by means of a second tension plate 243, and is secured to the first radius 217 by means of a second terminus 251.

The first tension plate 241 is shown in greater detail in FIG. 6. As seen therein, the first band 231 is adjoined to the first tension plate 241 by way of a first weld joint 261. The first tension plate 241 is secured to the second radius 219 by means of a spring-loaded screw 271.

The first terminus 251 is shown in greater detail in FIG. 7. As seen therein, the first band 231 is adjoined to the first terminus 251 by way of a second weld joint 263. The first terminus 251 is, in turn, secured to the first radius 217 by way of a screw 273.

The band configuration described above is advantageous in that it effectively interlocks the movement of the first 213 and second 215 arms. Such a configuration is especially useful in semiconductor processing equipment having a frog leg design because, when properly implemented, it can essentially eliminate yaw.

Unfortunately, the aforementioned wrist assembly design has been found to require considerable maintenance in the field. For example, the first and second bands 231, 233 are prone to fracturing, thus requiring down time in the assembly line while new bands are installed. Given the extreme cost of downtime in semiconductor manufacturing, there is a need in the art to create a more robust design for a wrist assembly that overcomes this problem. There is also a need in the art for robotic arm assemblies which are suitable for use in semiconductor fabrication, which exhibit minimal yaw, and which can be used to accurately position wafers in a fabrication line. There is further a need in the art for a wrist assembly design that has no collision points, and thus exhibits a longer life cycle and reduced wear. These and other needs are met by the devices and methodologies disclosed herein and hereinafter described.

SUMMARY OF THE INVENTION

In one aspect, a wrist assembly for a robotic arm or other mechanical device is provided herein which comprises a first arm terminating in a first radius, a second arm terminating in a second radius, and a first band that extends around a portion of each of said first and second radii, said first band being free of weld joints. The wrist assembly is suitable for use in semiconductor fabrication, and exhibits minimal yaw.

In another aspect, a wrist assembly for a mechanical device is provided herein which comprises (a) first and second pivots, (b) a first arm terminating in a first radius that is rotatably connected to said first pivot, (c) a second arm terminating in a second radius that is rotatably connected to said second pivot, (d) a first band that extends around a portion of each of said first and second radii, said first band being attached on a first end to at least one of said first arm and said first radius, and being attached on a second end to at least one of said second arm and said second radius, and (e) a second band that extends around a portion of each of said first and second radii, said second band being attached on a first end to at least one of said second arm and said second radius, and being attached on a second end to at least one of said first arm and said first radius; wherein said first band is free of weld joints.

In another aspect, a wrist assembly for a mechanical device is provided herein which comprises (a) a first arm terminating in a first radius, (b) a second arm terminating in a second radius, and (c) a first band that extends around a portion of each of said first and second radii, said first band being attached to a terminus on a first end and being attached to a tension plate on a second end; wherein said band is releasably attached to at least one of said terminus and said tension plate.

In still another aspect, a wrist assembly for a mechanical device is provided herein, which comprises (a) a first arm terminating in a first radius, (b) a second arm terminating in a second radius, (c) a first band that extends around a portion of each of said first radius and said second radius, and (d) a fastener adapted to attach said first band to at least one of said first radius such that said first band is rotatable about said fastener.

In yet another aspect, a wrist assembly for a mechanical device is provided herein which comprises (a) a first arm terminating in a first radius, (b) a second arm terminating in a second radius, (c) a first band that extends around a portion of each of said first radius and said second radius, (d) a first fastener adapted to attach a first terminal portion of said first band to at least one of said first arm and said first radius, and (e) a second fastener adapted to attach a second terminal portion of said first band to at least one of said first arm and said first radius; wherein said first fastener has an axis and allows the first terminal portion of the first band to pivot about said axis.

In still another aspect, a wrist assembly for a robotic arm is provided which comprises (a) a first arm terminating in a first radius, and a second arm terminating in a second radius, (b) a band having a first terminal portion with a first aperture defined therein, and a second terminal portion with a second aperture defined therein, said band extending around a portion of each of said first radius and said second radius, and (c) a mechanism for attaching said first terminal portion to at least one of said first arm and said first radius, said mechanism being equipped with a member which extends through said first aperture such that said first terminal portion is rotatable about said member.

In a further aspect, a method of constructing a wrist assembly for a robotic arm is provided herein which comprises the steps of (a) providing a first arm terminating in a first radius, and a second arm terminating in a second radius, (b) providing a band having a first terminal portion with a first aperture defined therein, and a second terminal portion with a second aperture defined therein, (c) extending the band around a portion of each of said first radius and said second radius, and (d) either (1) attaching the first terminal portion to at least one of said first arm and said first radius by way of a terminus, said terminus being equipped with a protrusion which extends through said first aperture such that said first terminal portion is rotatable about said protrusion, or (2) attaching the second terminal portion to at least one of said second arm and said second radius by way of a tension plate, said tension plate being equipped with a fastener that extends through said second aperture such that said second terminal portion is rotatable about said fastener.

In another aspect, a method is provided herein for attaching a band in a robotic joint to a substrate. In accordance with the method, a band is provided which has a terminal portion with a first aperture defined therein. A terminus is also provided which is equipped with a protrusion which is adapted to rotatingly engage the first aperture, said terminus being further equipped with a fastener suitable for attaching the terminus to the substrate. The protrusion is positioned within the first aperture, and the terminus is attached to the substrate by way of the fastener.

In another aspect, a method is provided herein for attaching a band in a robotic joint to a substrate. In accordance with the method, a band is provided having a terminal portion with a first aperture defined therein. A tension plate is also provided which is equipped with an element which is adapted to rotatingly engage said first aperture, said tension plate being further equipped with a fastener suitable for attaching the tension plate to the substrate. The tension plate is then attached to the substrate by way of the fastener, and the element is inserted into said first aperture.

In a further aspect, there is provided herein a terminus in combination with a metal band in a robotic joint, wherein said metal band has a terminal portion with a first aperture defined therein. The terminus comprises a fastener suitable for attaching the terminus to a substrate, a second aperture adapted to receive said fastener, and a protrusion adapted to engage said first aperture.

In yet another aspect there is provided herein a tension plate in combination with a metal band in a robotic joint, wherein said metal band has a terminal portion with a first aperture defined therein. The tension plate comprises a fastener suitable for attaching the tension plate to a substrate, a member insertable into said first aperture, said member being adapted to rotatingly engage the terminal portion of said band, and a second aperture adapted to receive said member.

One skilled in the art will appreciate that the various aspects of the present disclosure may be used in various combinations and sub-combinations, and each of those combinations and sub-combinations is to be treated as if specifically set forth herein.

BRIEF DESCRIPTION OF THE DRAWINGS

For a more complete understanding of the present invention and the advantages thereof, reference is now made to the following description taken in conjunction with the accompanying drawings in which like reference numerals indicate like features and wherein.

DETAILED DESCRIPTION OF THE INVENTION

Figure 1:
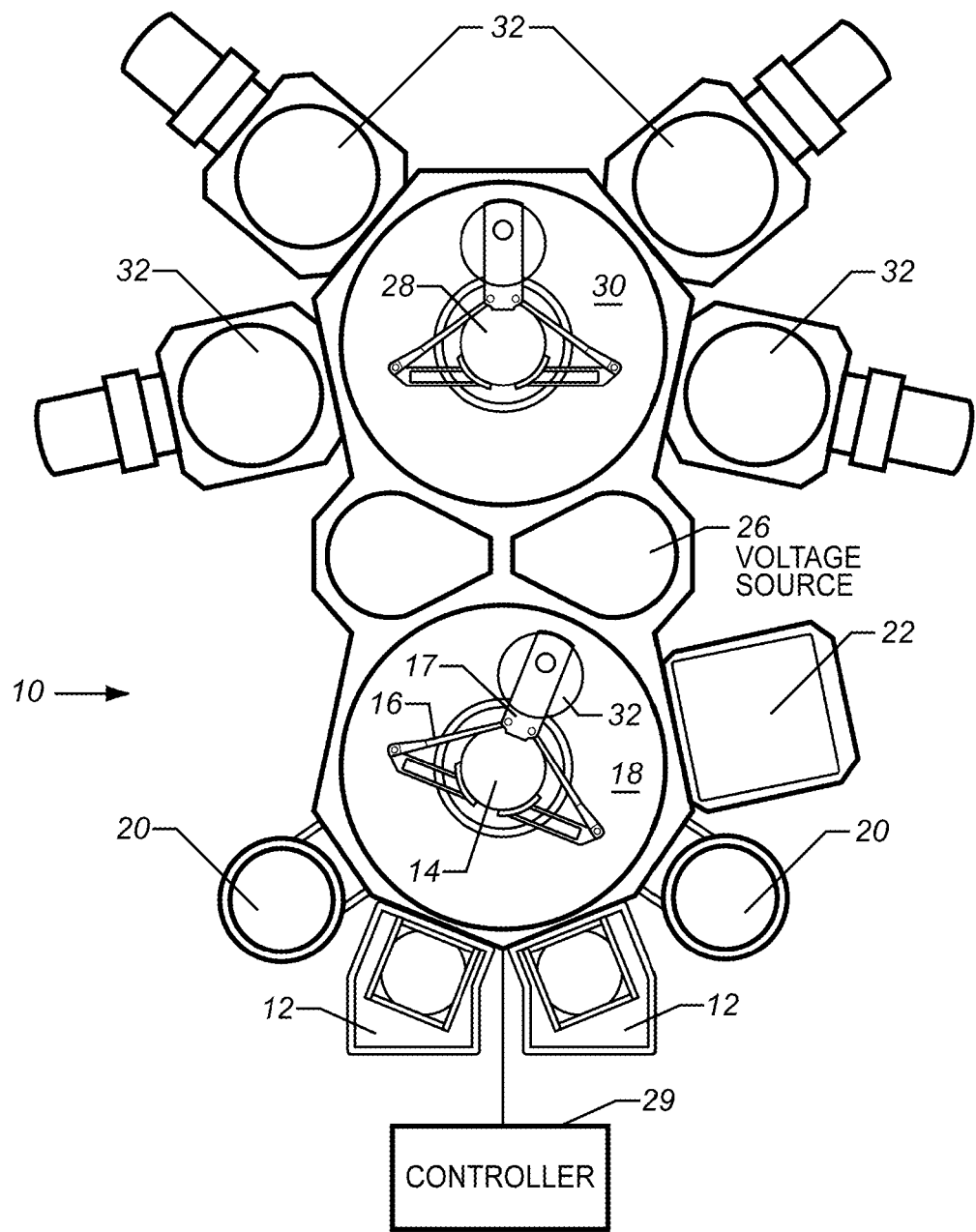
FIG. 1 is an illustration of a cluster tool equipped with a robotic wafer handling system.
Figure 2:
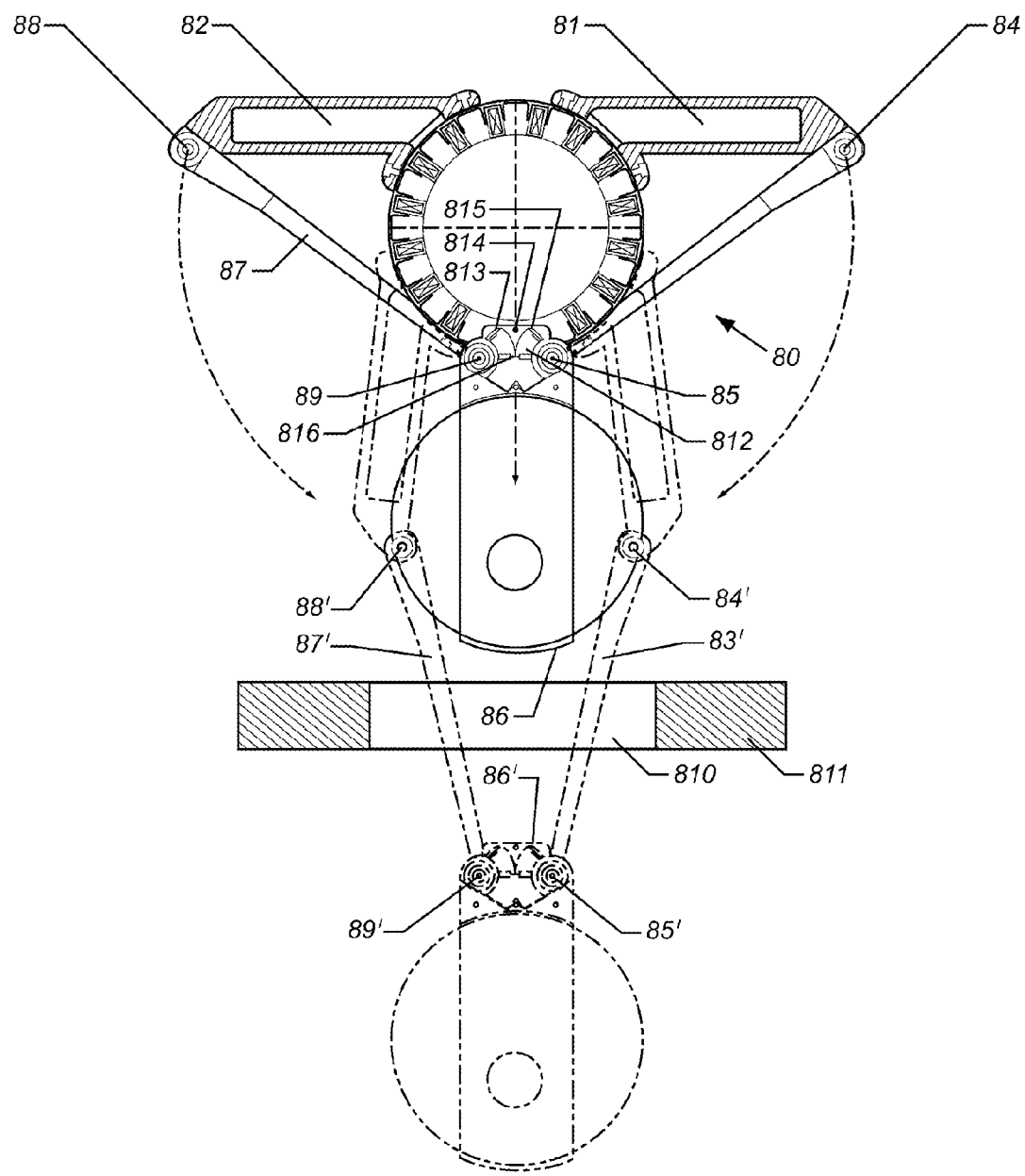
FIG. 2 is an illustration of the arm assembly of the robot depicted in FIG. 1, and illustrates the retracted and extended positions of the arm assembly.
Figure 3:
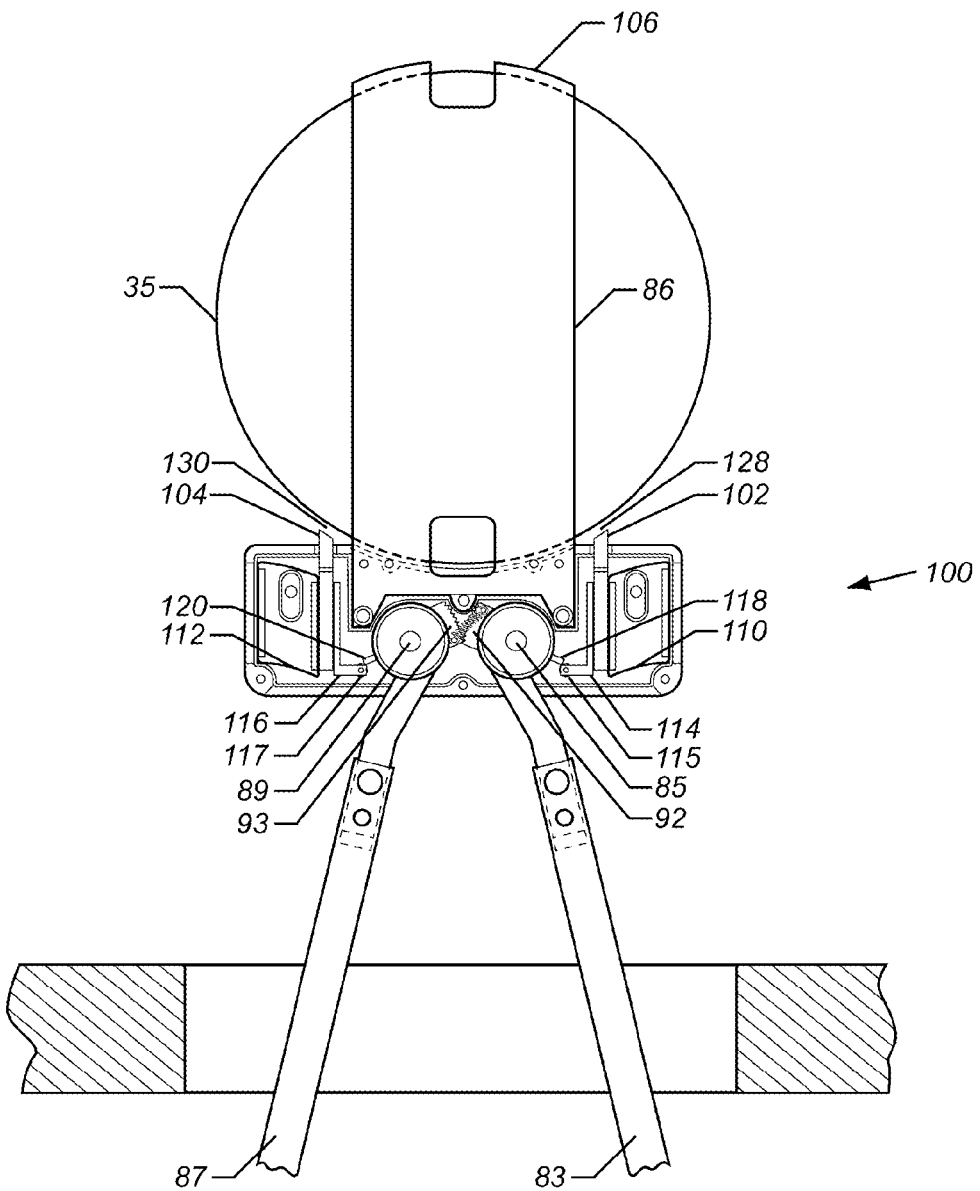
FIG. 3 is an illustration of the wrist assembly of the robot depicted in FIG. 1.
Figure 4:
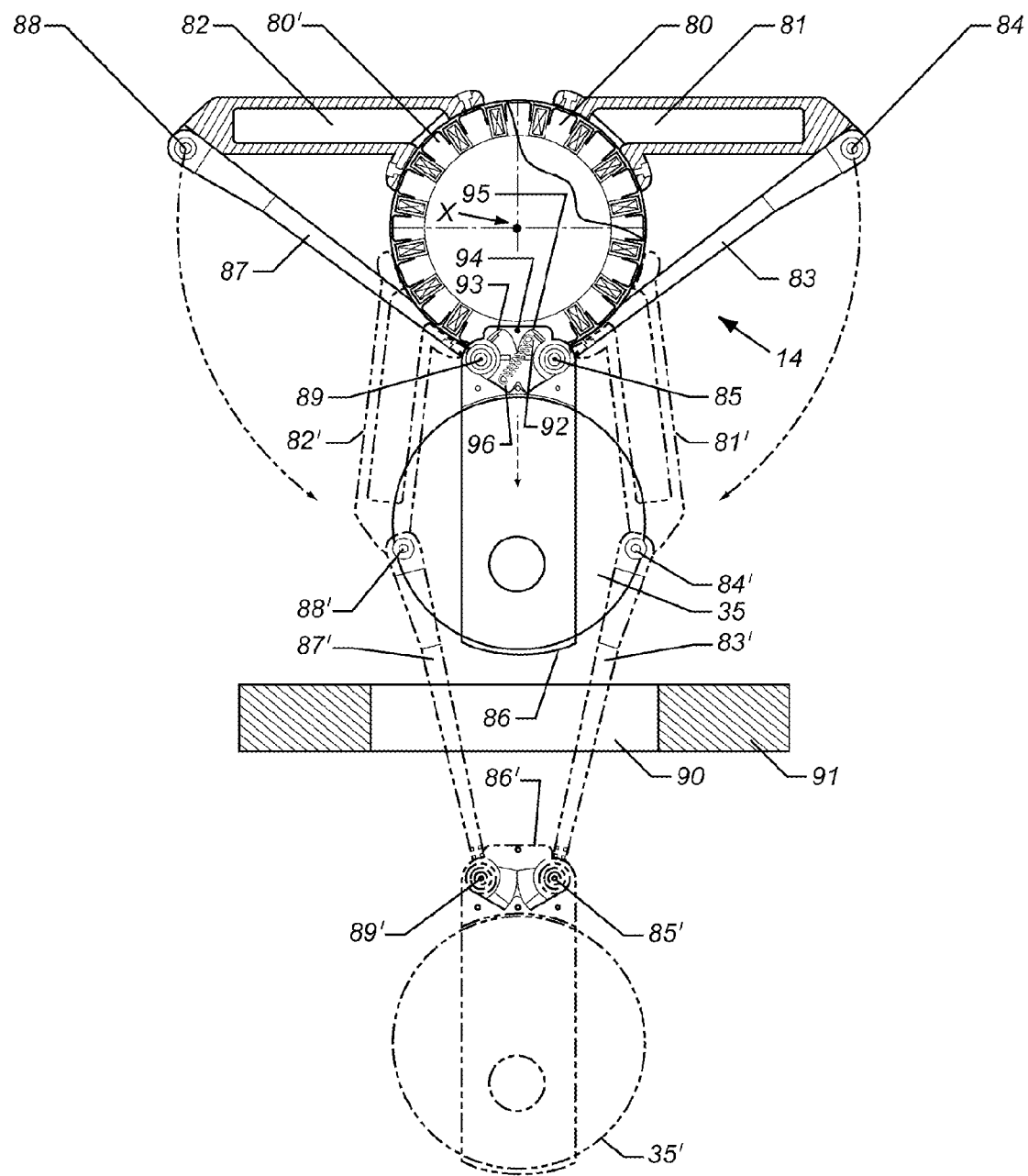
FIG. 4 is an illustration of a prior art robotic arm assembly and illustrates the retracted and extended positions of the arm assembly.
Figure 5:
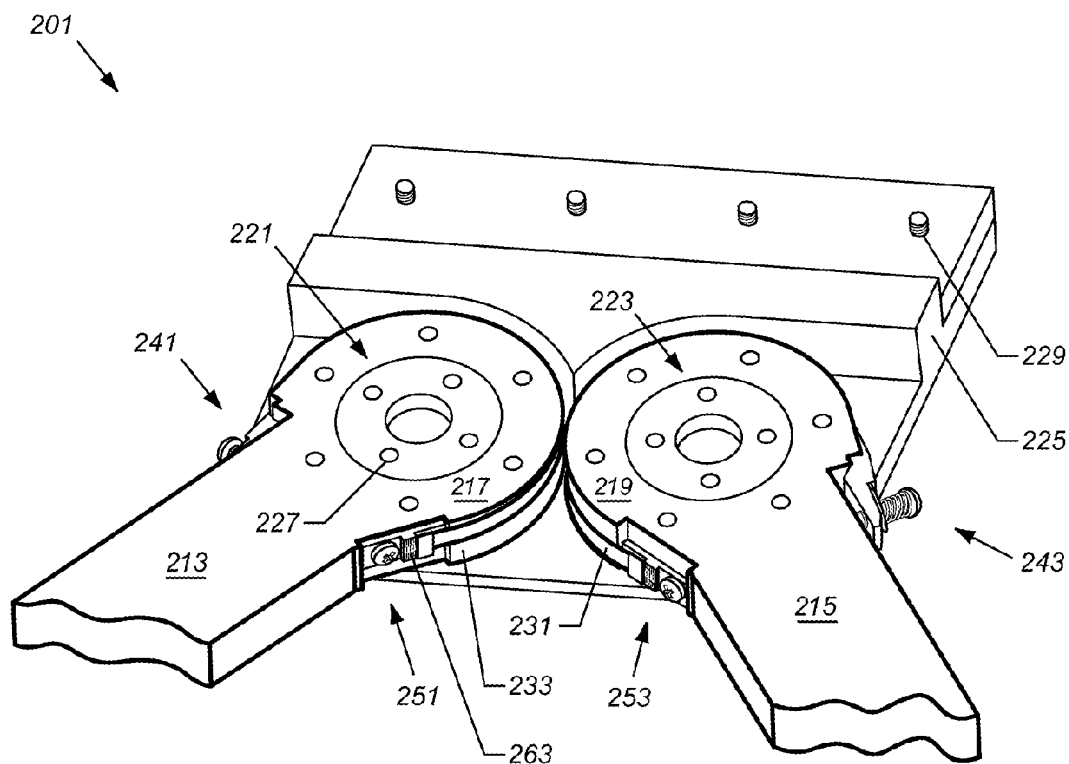
FIG. 5 is a perspective view of a prior art wrist assembly.
Figure 6:
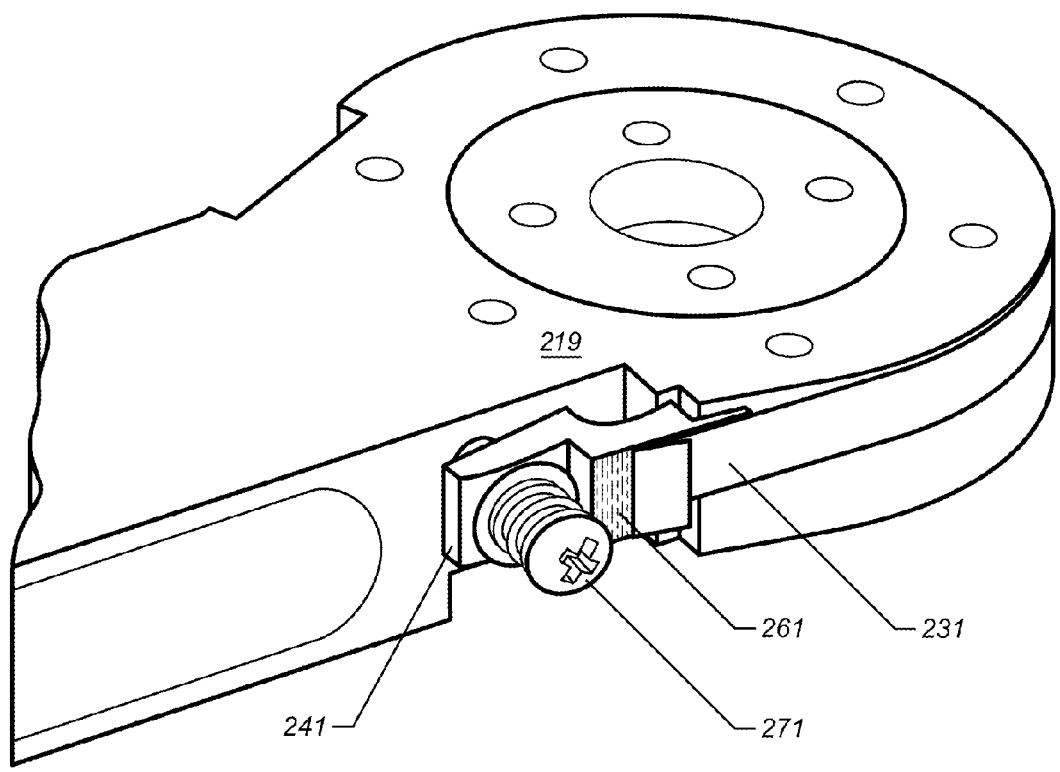
FIG. 6 is a close-up view of the tension plate mechanism of the wrist assembly of FIG. 5.

After careful investigation, it has now been determined that the aforementioned problem with the fracturing of metal bands in robotic wrist assemblies arises from the presence of weld joints in the bands. In the commercially available wrist assembly depicted in FIGS. 5-7, each of the metal bands has two weld joints. Thus, for example, the first band 231 has a first weld joint 261 where the band is adjoined to the tension plate 241, and a second weld joint 263 where the band is adjoined to the terminus 253. These weld joints have been found to create significant stresses and/or weaknesses in the structural integrity of the band such that the band is prone to fracturing at, or in the vicinity of, the weld joints located in the terminal portions of the band. Consequently, frequent replacement of the band is often necessary. For example, the bands of this type of wrist assembly have been observed to fracture when the robotic arm strikes a stationary object (such as the side of a process chamber), an event often encountered during calibration of a robotic arm.

Without wishing to be bound by theory, it is believed that the aforementioned weld joints contribute to stresses or weaknesses in the band in a variety of ways. For example, weld joints have the effect of rigidly fixing the terminal portion of the band in place so that it cannot rotate as necessary to compensate for imperfections in the machining and assembly of the device; this has the effect of increasing stress in the terminal portions of the band. Moreover, the creation of a weld joint can lead to metal thinning, changes in crystallinity, and other effects that can adversely affect the mechanical integrity of the band in the vicinity of the weld joint.

It has now been found that these problems can be avoided by eliminating the presence of weld joints in the metal bands of the wrist assembly. This may be accomplished, for example, by fastening one or both terminal portions of the bands to the respective robotic arm or radius in such a way that at least a limited degree of rotation of the terminal portion of the band is possible. Thus, for example, a terminal portion of the band may be provided with a aperture through which a screw, pin, protrusion, or other such member is inserted in such a way that the terminal portion of the band is at least partially rotatable about the member, and this member may be attached directly or indirectly to the respective arm or radius. This approach has been found to have the effect of alleviating strain in the terminal portion of the band. A similar result may be achieved using any of a variety of properly constructed clamps to secure the band to the substrate if the clamps also allow at least a limited degree of rotation at or near the point of attachment.

Because such an approach does not adversely affect the structural integrity of the band, the incidence of band failure is dramatically reduced. At the same time, the other benefits of this type of wrist assembly noted above—namely, elimination of yaw in a robot having a frog-leg design by effectively interlocking the movement of the arms of the robot—are preserved.

Figure 8:
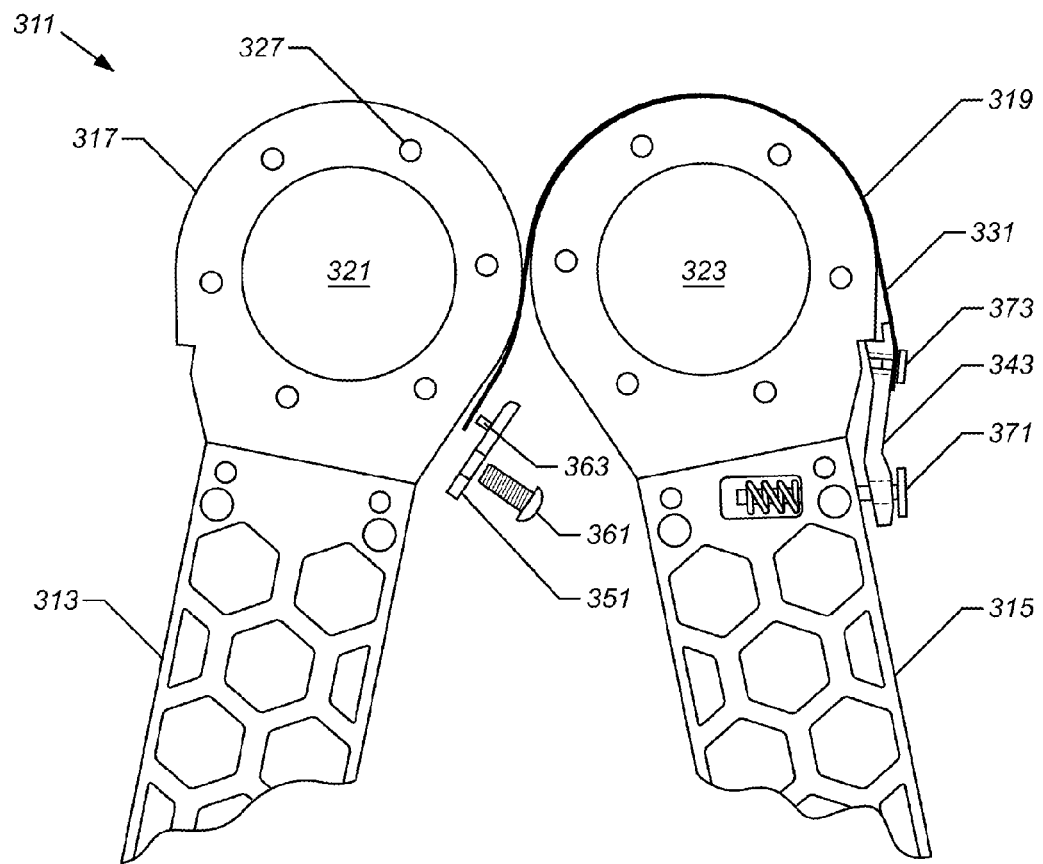
FIG. 8 is a top view of one embodiment of a wrist assembly made in accordance with the teachings herein, which shows the manner in which the metal bands are joined to the tension plate and terminus.

One possible embodiment of this type of configuration is depicted in FIG. 8. The wrist assembly 311 depicted therein is equipped with a first arm 313 that terminates in a first radius 317 which is rotatably connected to a first pivot 321 by a series of bolts or other fasteners 327, and a second arm 315 that terminates in a second radius 319 that is also rotatably connected to a second pivot 323 in a similar manner. The first and second arms are then interlocked by way of a first band 331 that extends around a portion of each of said first and second radii, and a second band (not shown) that extends around a portion of each of said first and second radii.

Significantly, the first and second bands in the wrist assembly of FIG. 8 are attached to the appropriate arm, radius or substrate without the creation of a weld joint. In the particular embodiment depicted, this is achieved on the terminus side by providing a terminus 351 having an aperture therein through which a fastener 361 extends. In the particular embodiment depicted, the fastener utilized is a threaded bolt or screw that engages a complimentary threaded aperture disposed in the radius 317 (in some embodiments, this aperture may be disposed in the arm instead), but one skilled in the art will appreciate that a variety of other types of fasteners may also be used for this purpose. The terminus 351 is further equipped with a protrusion 363 that extends through a hole provided in the terminal portion of the steel band 331. The radius 317 (or arm) may be provided with an aperture of appropriate dimensions to accept this protrusion. The protrusion may also be provided with a distal end that is rounded and/or slightly enlarged to maintain the protrusion within the hole provided in the terminal portion of the band.

On the tension plate side, the first band 331 is attached to the tension plate 343 by way of a pin 373 or other suitable fastener which extends through an aperture provided in the terminal portion of the band, and further extends through or into an aperture provided in the tension plate 343. The tension plate 343 is in turn attached to the arm 315 by way of a spring-loaded screw 371.

In addition to avoiding the problems presented by the presence of weld joints, the method described above for attaching the terminal portions of the steel band 331 to the radii of first 313 and second 315 arms (or to the arms themselves) also permits a limited degree of rotation of the respective terminal portion of the band 331 around the fasteners 361, 373. This has the effect of allowing the band 333 to pivot around the fasteners 361, 373 as necessary to compensate for imperfections in the machining and assembling of the device and to relieve stress in the terminal portions of the band, thus further reducing the incidence of fracture.

Figure 9:
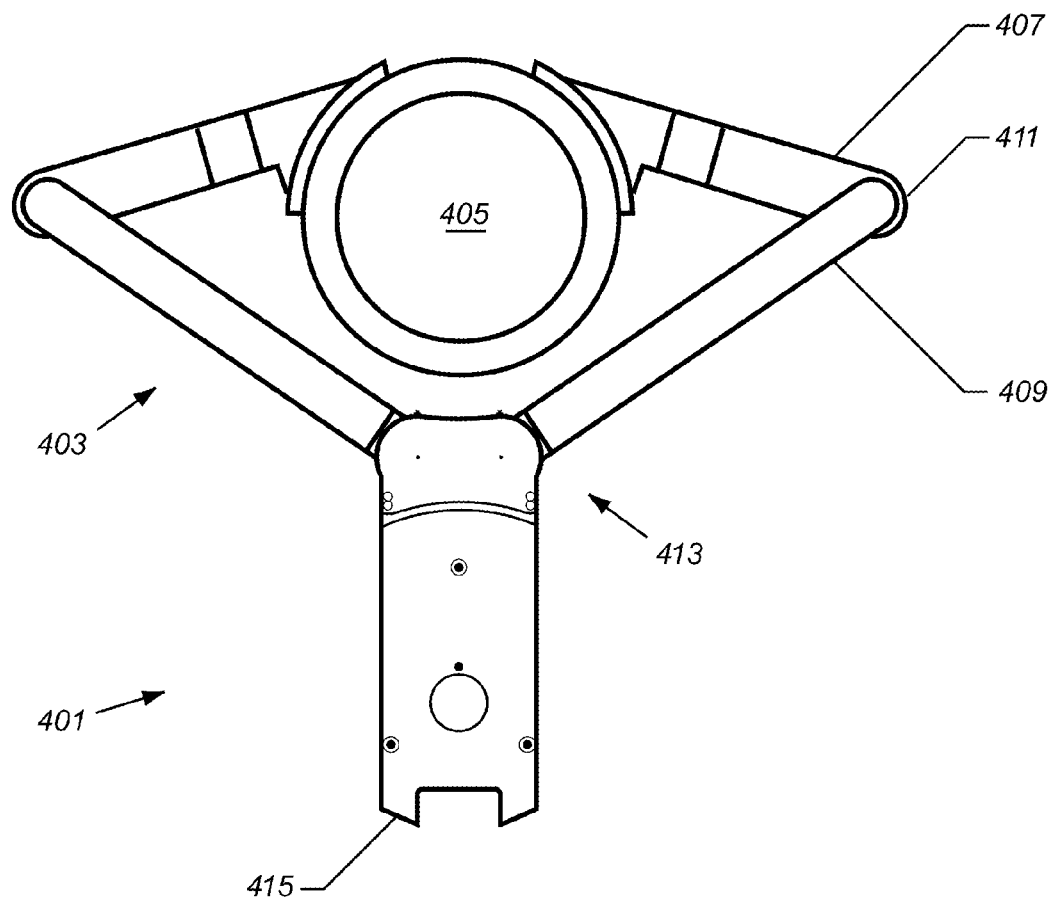
FIG. 9 is a top view of one embodiment of a robot made in accordance with the teachings herein.
Figure 10:
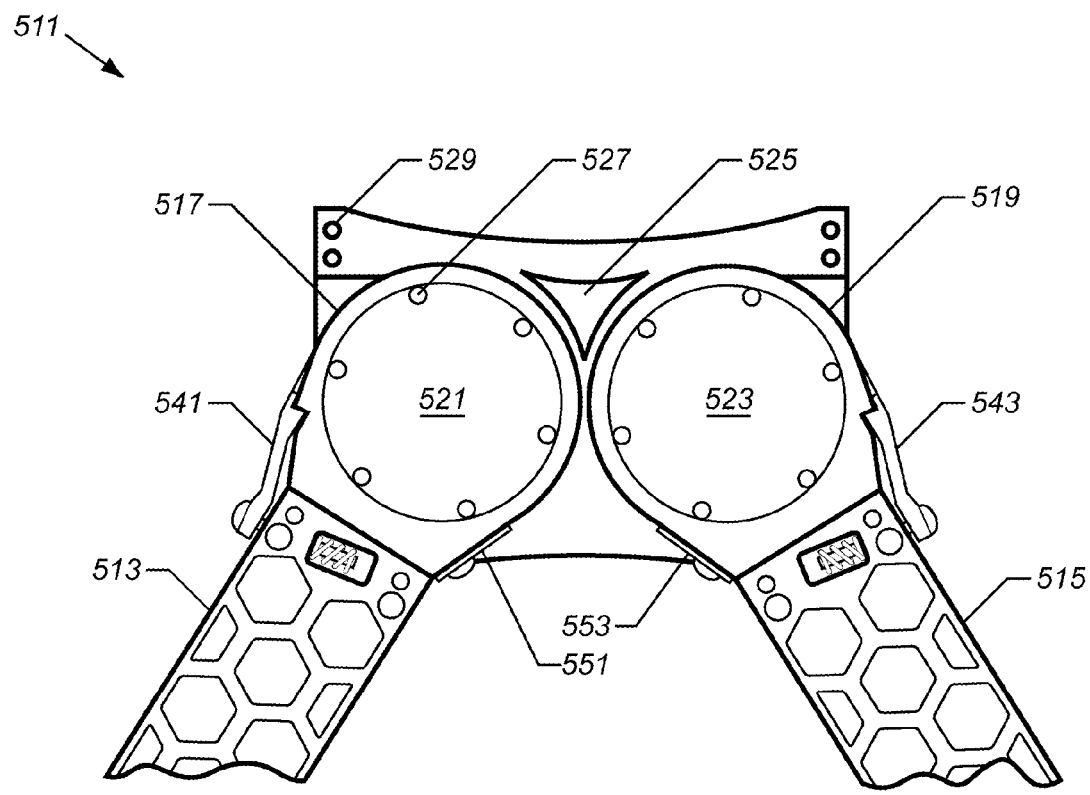
FIG. 10 is a top view of one embodiment of a wrist assembly for a robotic arm made in accordance with the teachings herein.
Figure 11:
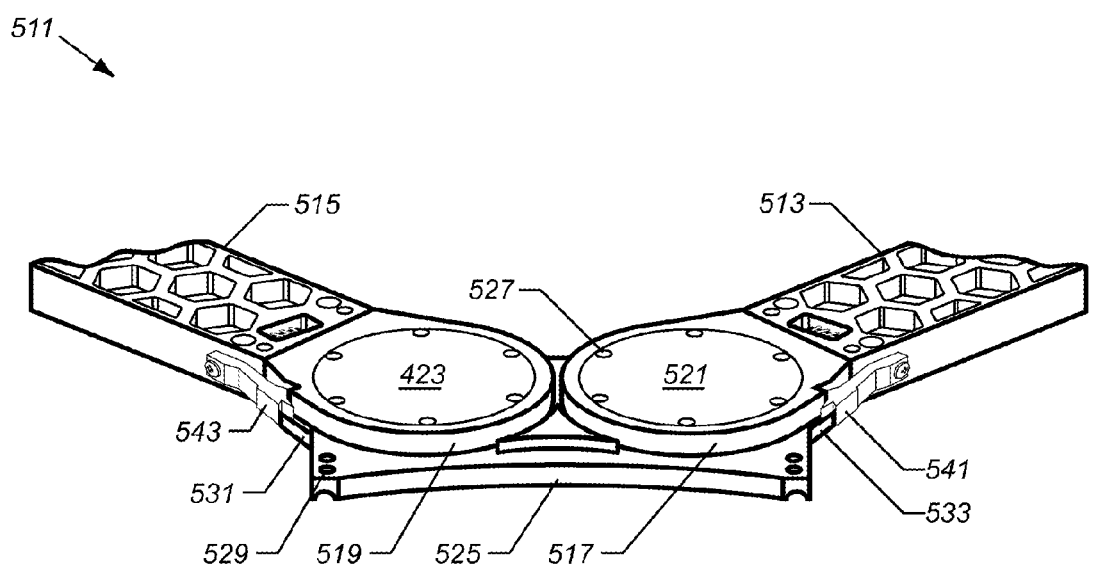
FIG. 11 is a perspective view of one embodiment of a wrist assembly for a robotic arm made in accordance with the teachings herein.

FIG. 9 illustrates one example of a robot made in accordance with the teachings herein. The particular robot 401 depicted therein has a frog-leg design and comprises first and second arms 403 that are slidingly engaged to a hub 405. Each arm further comprises a lower arm 407 and a forearm 409 which are rotatingly engaged by means of an elbow 411. The two forearms terminate in a wrist assembly 413 to which is releasably mounted an end effector 415.

With reference to FIGS. 10-14, a wrist assembly for a robotic arm made in accordance with the teachings herein is illustrated. The wrist assembly 511 comprises first 513 and second 515 arms. The first and second arms terminate, respectively, in first 517 and second 519 radii which rotatingly engage first 521 and second 523 pivots attached to a blade mount 525 (see FIGS. 5 and 6) by a series of fasteners 527. Preferably, the fasteners are button head screws, although a variety of other fasteners are known to the art that may also be utilized. A blade (not shown) can be secured to the blade mount via machined holes 529.

Figure 7:
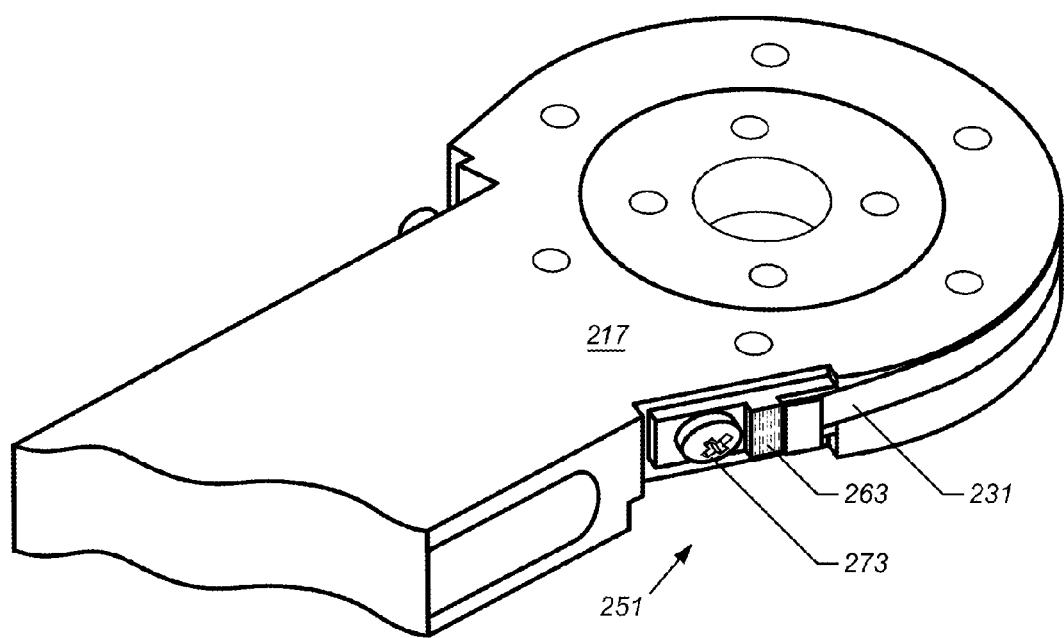
FIG. 7 is a close-up view of the terminus of the wrist assembly of FIG. 5.

FIGS. 7 and 8 illustrate the means by which the first 517 and second 519 radii rotatably engage the first 521 and second 523 pivots. First 531 and second 533 bands are provided that wrap around a portion of the radius of each of the first 517 and second 519 radii. The first 531 and second 533 bands may be, for example, 0.005" spring steel bands.

The first band 531 is secured to the first radius 517 by means of a first tension plate 541, and is secured to the second radius 519 by means of a first terminus 553. Similarly, the second band 533 is secured to the second radius 519 by means of a second tension plate 543, and is secured to the first radius 517 by means of a second terminus 551. The first 531 and second 533 bands are precision machined flat and are sufficiently wide such that, when they are disposed on the radial surfaces of the first 517 and second 519 radii (see FIG. 10) and the tension is properly adjusted, they maintain their respective positions.

The band configuration described above is advantageous in that it effectively interlocks the movement of the first 513 and second 515 arms. Such a configuration is especially useful in semiconductor processing equipment having a frog leg design because, when properly implemented, it can essentially eliminate yaw.

Figure 13:
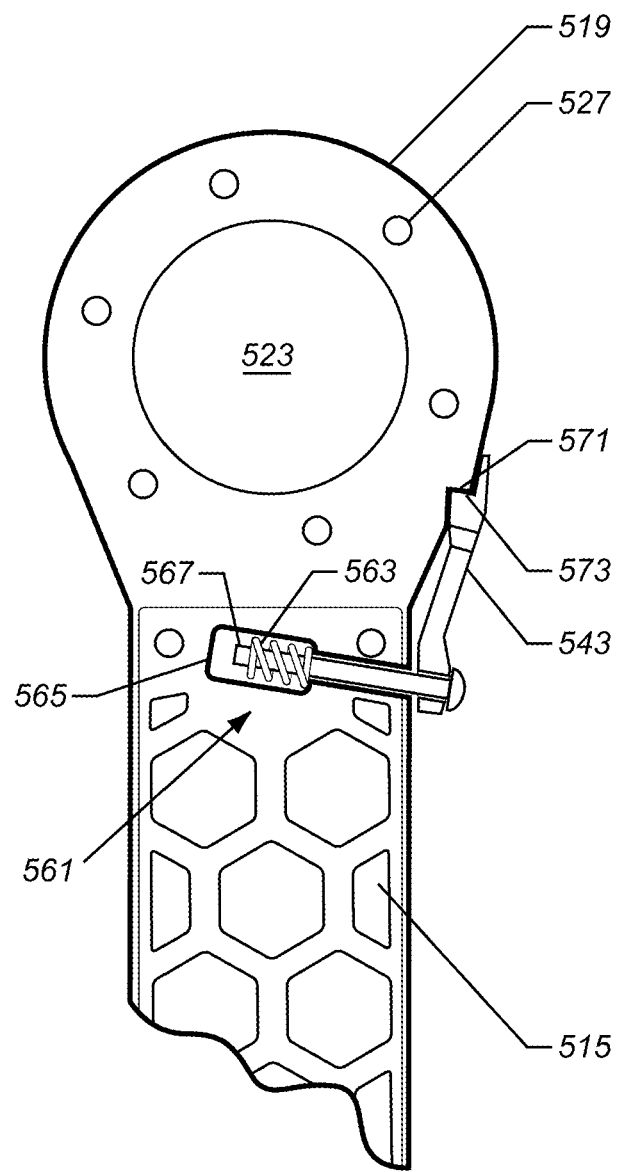
FIG. 13 is an illustration depicting one embodiment of the tension spring assembly in a wrist assembly made in accordance with the teachings herein.
Figure 14:
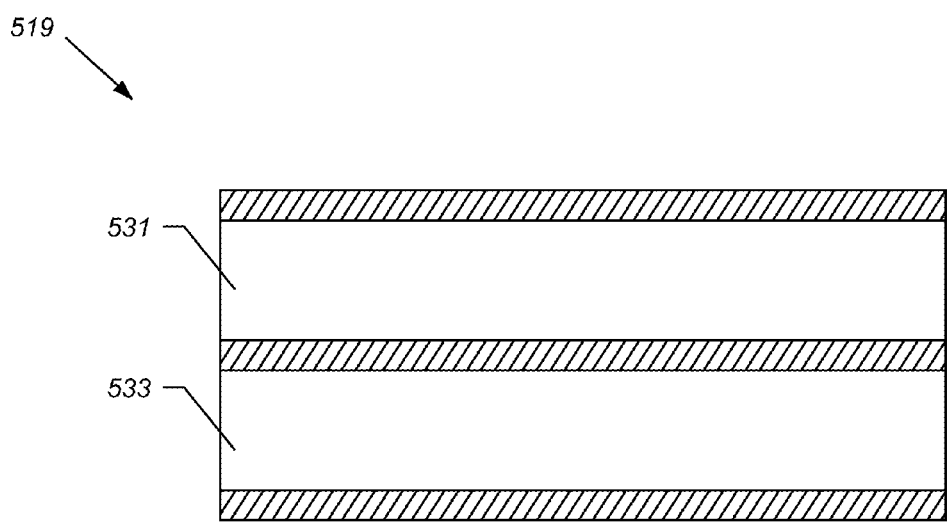
FIG. 14 is a side view of one embodiment of a pivot made in accordance with the teachings herein.

With reference to FIG. 13, a spring assembly 561 is provided in the forearm of the first 513 arm. The spring assembly could also be provided in the second 515 arm; however, it is preferred that only one of the first and second arms is provided with a spring assembly, since the presence of two assemblies can complicate adjustment and alignment of the system. The spring assembly 561 comprises a constant tension preloaded spring 563 disposed in a channel 565 in that forearm. The spring is axially disposed on one end of a pin 567 which extends through a hole in the tension plate 543. The spring exerts a constant tension on the band 533 by way of the tension plate 543.

The disposition of the spring assembly 561 in the forearm is advantageous in that it protects the spring assembly from damage resulting from physical contact or from the processing environment. This disposition also prevents the tension in the wrist assembly from being readily modified by unqualified field technicians. Moreover, because the spring assembly can rotate freely about the axis of the pin 567, the spring assembly 561 will maintain its preset tension, even if the pin 567 is rotated by accident or by an unqualified field technician. Consequently, situations in which the spring tension is unintentionally adjusted, or adjusted by an unqualified technician, can be avoided.

Figure 12:
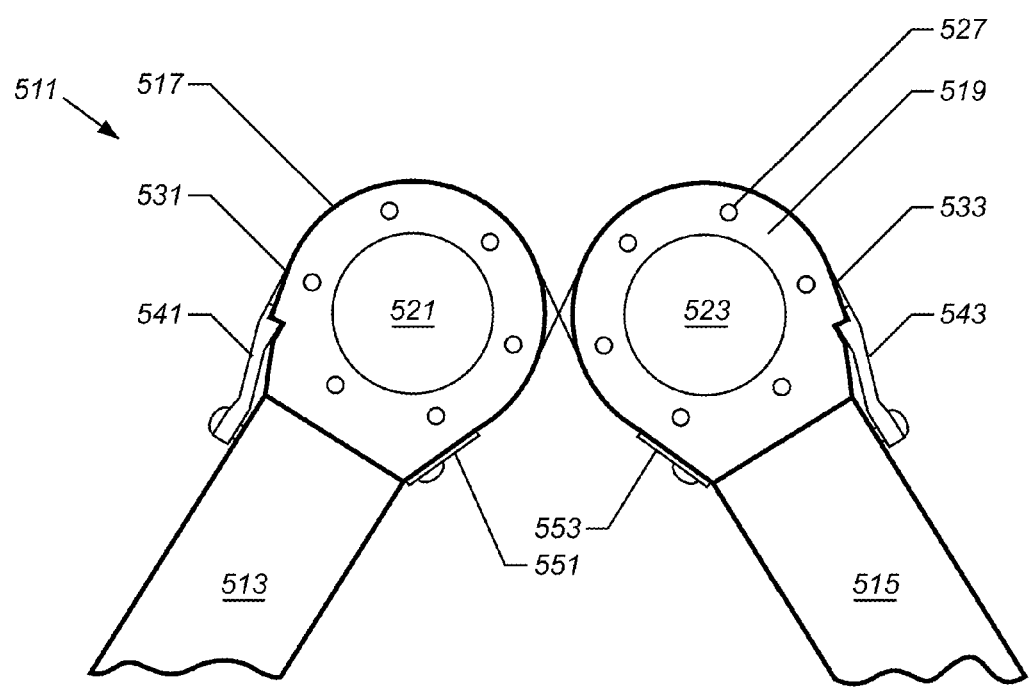
FIG. 12 is an illustration depicting the band configuration in one embodiment of a wrist assembly for a robotic arm made in accordance with the teachings herein.

Another notable feature of the wrist assemblies 511 disclosed herein relates to the attachment of the band 533 to the tension plate 543 and the terminus 553, as shown in FIG. 12. Each end of the band 533 has a precision drilled hole that allows the band to be secured to the radius 519 by way of a pin 567. As with the embodiment depicted in FIG. 8, this arrangement allows the band 533 to pivot around the pin 567 as necessary to alleviate stress and to compensate for imperfections in the machining and assembling. By contrast, it has been found that other means of securing the band to the radius 519, such as welding, can cause the band and/or the tension plate 543 or terminus 553 to break apart under stress.

As seen in FIG. 13, the radius 519 is equipped with a step 571. The tension plate 543 terminates on one end in a protrusion 573 which engages the step 571. This arrangement allows the tension plate 543 to rotate about the step 571, thus maintaining the tab under constant spring tension and eliminating yaw.

Various methods may be used to assemble wrist assemblies of the type described herein. In one preferred method which may be understood with respect to FIG. 7, a first band 531 is connected to a tab tension plate 541 disposed on the first radius 517. For the sake of convenience, this first band will be assumed to be the lower band (that is, the band which is placed in track 533 on radii 519 in FIG. 14). The first band 531 is then routed around the radius 517 of arm 513 and crossed over to the radius 519 of arm 515. At this point the first band is secured to second terminus 553. The second band 533 is then attached to tension plate 543 and is routed over the radius 519 of arm 515 and over the first band 531 (at the cross over mid point) and attaches to first terminus 551.

Figure 15:
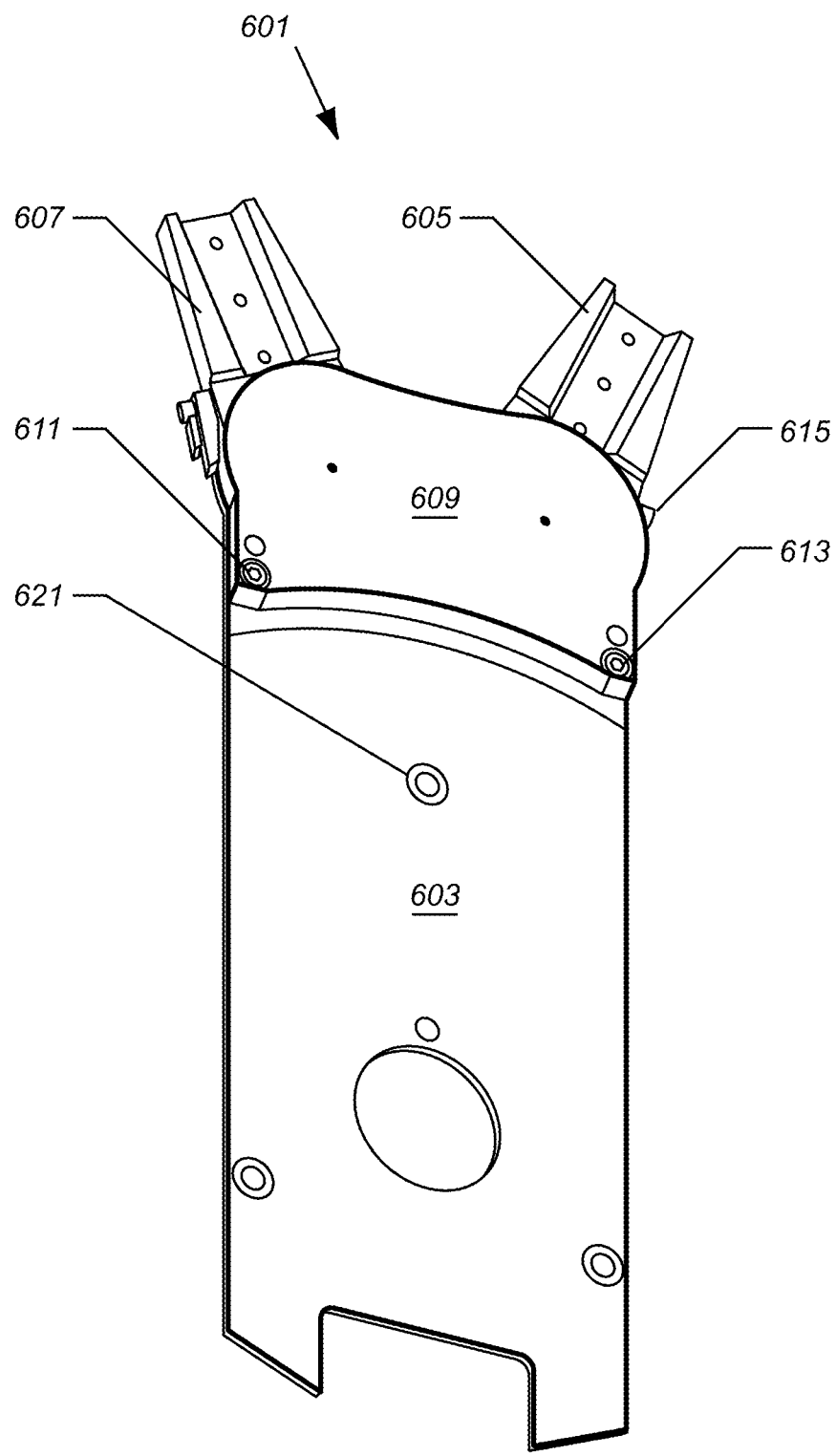
FIGS. 15-17 are illustrations of one particular embodiment of a wrist assembly made in accordance with the teachings herein.
Figure 16:
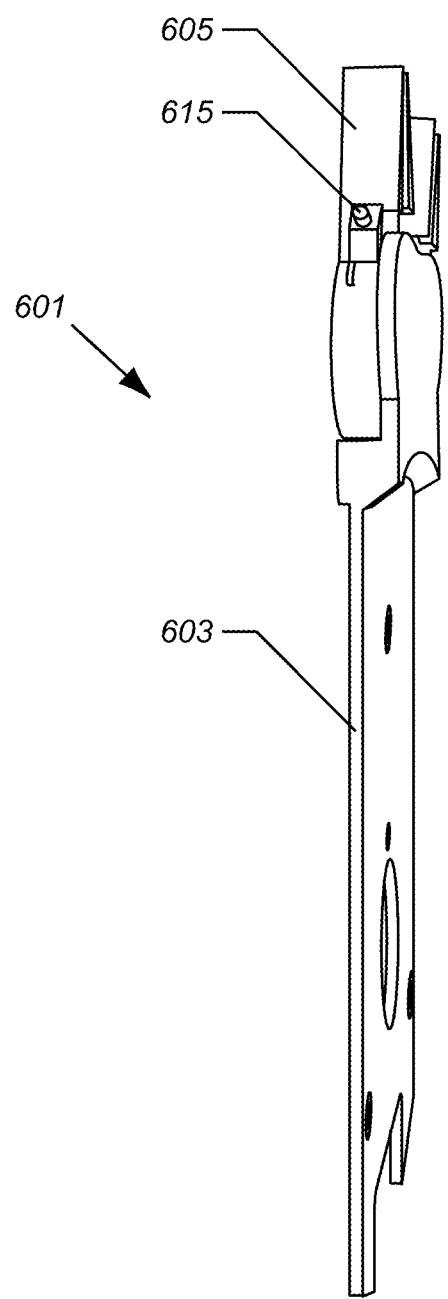
Figure 17:
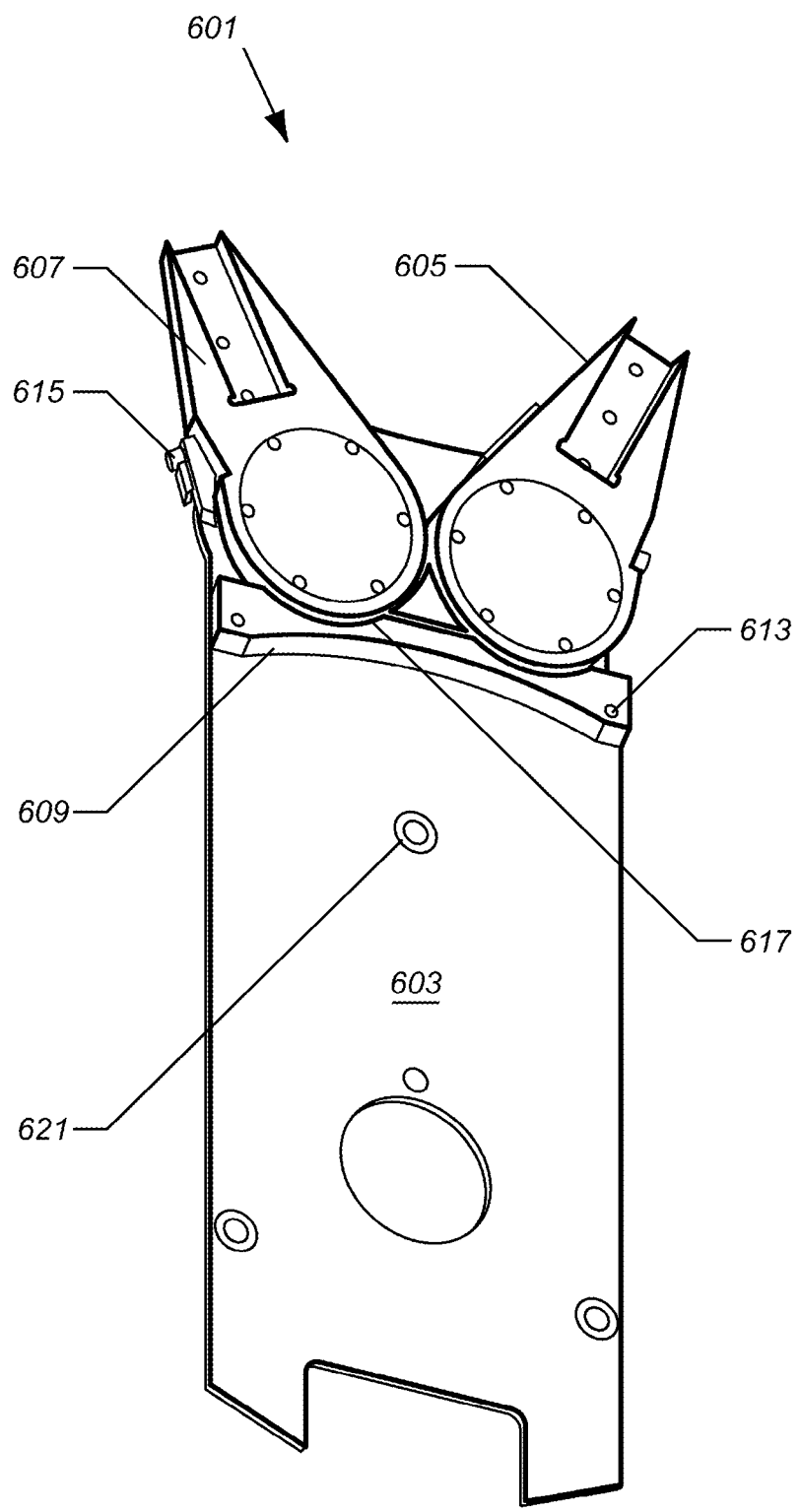

FIGS. 15-17 illustrate a further embodiment of the wrist assembly disclosed herein. The wrist assembly 601, which is depicted with a blade 603 attached thereto, is very similar in most respects to the wrist assembly illustrated in FIGS. 10-14. However, this wrist assembly is created as a replacement item for existing wrist assemblies in robots. Accordingly, the wrist assembly is provided with tabs 605 by which the wrist assembly can be secured to the forearms of an existing robot. The tabs 605 are provided with a series of apertures 607 through which a screw or other fastening device may be extended to secure the wrist assembly to the forearms of a robot.

Typically, the tabs found on prior art wrist assemblies are flat and rectangular in shape. By contrast, the tabs 605 in the embodiment depicted in FIGS. 15-17 are corrugated in shape and are thicker along the outer edges. This additional thickness improves the mechanical integrity of the tabs and has been found to increase the lifetime of the wrist assembly and its overall performance.

FIGS. 15 and 17 illustrate another feature of the wrist assemblies disclosed herein. As seen therein, the blade mount 609 of the wrist assembly is provided with a set of cap head screws 611 which secure the blade 603 to the blade mount 609. The blade mount 609 is equipped with a slot into which one end of the blade is inserted such that the blade mount overlaps the blade 603 on the top and bottom, thereby providing additional mechanical integrity to the blade. The cap head screws 611 extend through the top overlapping section of the blade mount 609 and press against the blade, thereby securing it in place.

A set of threaded openings 613 are provided on the bottom of the blade mount (see FIG. 17) and on the top of the blade mount adjacent to each cap head screw 611. Each of these openings is adapted to accept a set screw (not shown). The set screws allow for fine adjustments to the position of the blade to be made so that the blade can be maintained in a level position at all times. In replacement operations in which the blade and/or wrist assembly are being replaced on an existing tool, the set screws can be used in conjunction with a bubble level or other leveling device to ensure that the blade is properly positioned in the repaired tool.

Referring again to FIGS. 15-17, the wrist assembly shown therein is equipped with a constant tension preloaded spring 615. This spring 615 is functionally equivalent to the spring 667 shown in FIG. 13. However, the wrist assembly depicted in FIG. 13 is designed for 300 mm tooling, and is thus large enough to easily permit the spring to be housed in the interior of the forearm 515 of the tool, due to the greater distance between the channel 565 and the rotating pivot 523. By contrast, the wrist assembly 601 depicted in FIGS. 15-17 is designed for 200 mm tooling. At this size, the distance between the channel and pivot is sufficiently small that it becomes more convenient to have the spring 615 disposed on the exterior of the forearm (and in particular, in the tabs 605).

The wrist assembly depicted in FIGS. 15-17 further differs from the embodiment depicted in FIG. 13 in that the later has a spring assembly 561 that applies a preload tension to the radius 519 by pulling on the radius. By contrast, the wrist assembly depicted in FIGS. 15-17 applies a preload tension by pushing on the radius 617 (see FIG. 17).

Most of the components of the wrist assembly depicted in FIGS. 15-17 are constructed out of 6061 aluminum, including the blade 603, the tabs 605, the radius 617 and the outer plating of the pivots 619. The use of this material is advantageous in that this alloy is well accepted in the semiconductor industry and is easy to machine. It will be appreciated, however, that various other materials could also be used for these components, including, for example, alumina ceramic. The use of alumina ceramic may be particularly desirable in applications where particle contamination of substrates arising from frictional contact between the components of the robotic arm and surrounding surfaces and equipment is a problem. In particular, alumina ceramic is significantly harder than the aluminum alloys commonly used in the semiconductor industry, and is not easily scratched by most substrates. Moreover, alumina ceramic can be used in process tools where temperatures are as high as 1400° C. Consequently, its use can significantly reduce contamination of substrates and processing equipment in both high temperature and lower temperature applications. The use of alumina ceramic as the end effector or blade 603 material is particularly desirable in many applications. The use of such a blade in conjunction with the wrist assemblies described herein provides a product solution with significantly reduced particle count.

With reference to FIG. 15, the blade 603 depicted therein is equipped with a plurality of support pads 621. The support pads 621 preferably comprise a material, such as a perfluoroelastomer, that is resistant to substrate processing conditions, and that grips the substrate sufficiently (e.g., by creating a sufficiently high coefficient of friction with respect to the surface of the substrate) to hold the substrate in place during processing. The pads are positioned on the blade such that they contact the substrate away from the periphery of the substrate, and preferably so that they contact the substrate at a locus disposed approximately half way between the center of the substrate and the periphery of the substrate. It has been found that, by positioning the pads in this manner, sagging of the substrate is minimized. Without wishing to be bound by theory, it is believed that sagging of the substrate is a significant cause of substrate contamination in the use of robotic end effectors, since it can result in frictional contact between the substrate and the surface of the end effector. Hence, by reducing or eliminating sagging, the use of these pads allows substrate contamination to be significantly reduced. As with the alumina ceramic blades noted above, the use of these pads in conjunction with the wrist assemblies described herein provides a product solution with significantly reduced particle count.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A method of constructing a wrist assembly for a robotic arm, comprising:
   providing a first arm terminating in a first radius, and a second arm terminating in a second radius;
   providing a band having a first terminal portion with a first aperture defined therein, and a second terminal portion with a second aperture defined therein;
   extending the band around a portion of each of said first radius and said second radius;
   attaching the first terminal portion to at least one of said first arm and said first radius by way of a terminus, said terminus being equipped with a protrusion which extends through said first aperture such that said first terminal portion is rotatable about said protrusion, wherein the protrusion is adapted to rotatingly engage said first aperture, and wherein said terminus is further equipped with a first fastener suitable for attaching the terminus to a substrate;
   attaching the second terminal portion to at least one of said second arm and said second radius by way of a tension plate, said tension plate being equipped with a second fastener that extends through said second aperture such that said second terminal portion is rotatable about said second fastener;
   positioning the protrusion within the first aperture; and
   attaching the terminus to the substrate by way of the first fastener.

2. The method of claim 1, wherein said fastener is a pin.

3. The method of claim 2, wherein said pin has a longitudinal axis, and wherein said second terminal portion is rotatable about said longitudinal axis.

4. The method of claim 1, wherein said tension plate is further equipped with a tension-loaded screw that attaches said tension plate to at least one of said second arm and said second radius.

5. The method of claim 4, wherein said tension plate has first and second opposing ends, wherein said fastener is disposed on said first end of said tension plate, and wherein said tension-loaded screw is disposed on said second end of said tension plate.

6. The method of claim 1, wherein said terminus is further equipped with a second aperture, and further comprising extending said fastener through said second aperture.

7. The method of claim 1, wherein said terminus comprises a substantially planar plate.

8. The method of claim 1, wherein said tension plate is equipped with an element which is adapted to rotatingly engage said first aperture, and further comprising:
   attaching the tension plate to the substrate by way of the second fastener; and
   inserting the element into said first aperture.

9. The method of claim 8, wherein said second fastener is a spring-loaded screw.

10. The method of claim 8, wherein said tension plate further comprises a second aperture through which said second fastener is inserted.

11. The method of claim 10, wherein said first and second apertures are disposed at opposing ends of said tension plate.

12. The method of claim 8, wherein said element is a pin.

13. The method of claim 12, wherein said pin is equipped with a flattened head.

14. The method of claim 13, wherein said pin further comprises a shaft extending from said head, and wherein said shaft releasably engages said first aperture.

15. A method of constructing a wrist assembly for a robotic arm, comprising:
   providing a robotic subassembly including (a) a hub, (b) an end effector, (c) first and second elbow joints, (d) a first lower arm having a first end which is rotatably attached to said hub, (e) a second lower arm having a first end which is rotatably attached to said hub, (f) a wrist assembly, (g) a first forearm having a first end which is attached to a second end of said first lower arm by way of said first elbow, and having a second end which is attached to said end effector by way of said wrist assembly, (h) a second forearm having a first end which is attached to said second end of said first lower arm by way of said second elbow, and having a second end which is attached to said end effector by way of said wrist assembly, and (i) a wrist assembly comprising a first and second radius;
   providing a band having a first terminal portion with a first aperture defined therein, and a second terminal portion with a second aperture defined therein;
   extending the band around a portion of each of said first radius and said second radius; and
   performing at least one step selected from the group consisting of (a) attaching the first terminal portion to at least one of said first arm and said first radius by way of a terminus, said terminus being equipped with a protrusion which extends through said first aperture such that said first terminal portion is rotatable about said protrusion, and (b) attaching the second terminal portion to at least one of said second arm and said second radius by way of a tension plate, said tension plate being equipped with a fastener that extends through said second aperture such that said second terminal portion is rotatable about said fastener.

16. The method of claim 15, further comprising:
   attaching the first terminal portion to at least one of said first arm and said first radius by way of a terminus, said terminus being equipped with a protrusion which extends through said first aperture such that said first terminal portion is rotatable about said protrusion.

17. The method of claim 15, further comprising:
   attaching the second terminal portion to at least one of said second arm and said second radius by way of a tension plate, said tension plate being equipped with a fastener that extends through said second aperture such that said second terminal portion is rotatable about said fastener.

18. The method of claim 15, wherein said wrist assembly comprises (a) a first band that extends around a portion of each of said first radius and said second radius, (b) a first fastener adapted to attach a first terminal portion of said first band to at least one of said first forearm and said first radius, and (c) a second fastener adapted to attach a second terminal portion of said first band to at least one of said first forearm and said first radius.

19. The method of claim 15, wherein said first fastener allows the first terminal portion of the first band to pivot about an axis.

* * * * *